United States Patent
Lin et al.

(10) Patent No.: US 8,291,590 B2
(45) Date of Patent: Oct. 23, 2012

(54) METHOD FOR ASSEMBLING FINS-TYPE HEAT SINK

(75) Inventors: Kuo-Len Lin, New Taipei (TW); Chen-Hsiang Lin, New Taipei (TW); Chiao-Li Huang, New Taipei (TW); Ken Hsu, New Taipei (TW); Chih-Hung Cheng, New Taipei (TW)

(73) Assignees: CPUMate Inc., New Taipei (TW); Golden Sun News Techniques Co., Ltd., New Taipei (TW)

( * ) Notice: Subject to any disclaimer, the term of this patent is extended or adjusted under 35 U.S.C. 154(b) by 0 days.

(21) Appl. No.: 13/278,162

(22) Filed: Oct. 20, 2011

(65) Prior Publication Data
US 2012/0137518 A1  Jun. 7, 2012

Related U.S. Application Data

(62) Division of application No. 12/356,140, filed on Jan. 20, 2009.

(51) Int. Cl.
  *B21D 53/02* (2006.01)
  *F28D 15/02* (2006.01)
(52) U.S. Cl. .............. 29/890.032; 29/890; 165/80.3; 165/104.26; 165/104.33

(58) Field of Classification Search .......... 29/890.03, 29/890.032; 165/80.3, 104.26, 104.33, 185
See application file for complete search history.

(56) References Cited

U.S. PATENT DOCUMENTS

| | | | |
|---|---|---|---|
| 2007/0131390 A1* | 6/2007 | Chen et al. | 165/104.33 |
| 2011/0024089 A1* | 2/2011 | Lin et al. | 165/104.26 |
| 2011/0056658 A1* | 3/2011 | Lin et al. | 165/104.26 |

* cited by examiner

*Primary Examiner* — Alexander P Taousakis
(74) *Attorney, Agent, or Firm* — Chun-Ming Shih; HDLS IPR Services

(57) ABSTRACT

A method for assembling a fins-type heat sink includes providing a heat sink, a presser and a plurality of caps, the heat sink having a heat pipe and a plurality of fins disposed on the heat pipe, the presser being provided with through-holes allowing the distal ends of the heat pipe to be inserted therein, a periphery of each through-hole being provided with an annular neck, the presser being provided with notches that are arranged circumferentially outside the annular neck; (b) covering the caps on the annular necks of the presser respectively, each caps extending downwards to form protruding flaps penetrating the notches; (c) disposing a plate-like die on the topmost fin of the heat sink; (d) inserting a distal end of the heat pipe through the through-hole of the presser to abut inside the cap, while folding the flaps outwards via the plate-like die.

3 Claims, 8 Drawing Sheets

METHOD FOR ASSEMBLING FINS-TYPE HEAT SINK

CROSS-REFERENCE TO RELATED APPLICATION

This application is a divisional application of U.S. patent application Ser. No. 12/356,140, filed on Jan. 20, 2009, the contents of which are hereby incorporated by reference in their entirety for all purposes.

BACKGROUND OF THE INVENTION

1. Field of the Invention

The present invention relates to a technique of assembling a heat sink, and in particular to a a method for assembling heat pipes and fins.

2. Description of Prior Art

As shown in FIG. 1, the conventional heat sink 1a includes a base 10a, at least one heat pipe 11a that is bent to upright on the base 10a, and a plurality of fins 12a provided on the heat pipe 11a. With the base 10a being brought into thermal contact with a heat source (not shown), the heat generated by the heat source can be transferred to the heat pipe 11a via the thermal contact with the base 10a. Then, the heat pipe 11a conducts the heat to the respective fins 12a, thereby dissipating the heat. Via this arrangement, a heat-dissipating effect can be achieved.

However, in the above-mentioned heat sink 1a, one end of the heat pipe 11a is an inactive end 110a because the diameter of the inactive end 110a is reduced when the heat pipe 11a is subjected to a sealing process. As a result, when the fins 12a are disposed on the heat pipe, this inactive end 110a cannot fit with the fins 12a tightly. Therefore, after the fins 12a are disposed on the heat pipe 11a piece by piece orderly, the fins 12a can be only fitted tightly with the heat pipe 11a via the other end rather than the inactive end 110a. Thus, the fins 12a may fall off the heat pipe 11a easily.

Therefore, in order to overcome the above problems, the present Inventor proposes a reasonable and novel structure based on his delicate researches and expert experiments.

SUMMARY OF THE INVENTION

The present invention is to provide a fins-type heat sink and a method for assembling the same. A presser and a plurality of caps are further disposed over the respective fins of the heat sink. The presser provides a pressing force to prevent the fins from falling off the heat pipe. Further, via the caps, the presser can press the distal ends of the heat pipe, thereby preventing the separation of the presser from the heat pipe.

The present invention is to provide a fins-type heat sink, which includes a base, a heat pipe thermally connected on the base, a plurality of fins disposed on the heat pipe at intervals, a presser and a plurality of caps. Each of the fins is provided with penetrating holes. The outer periphery of the penetrating hole is formed with an annular wall. The presser is provided with through-holes for cooperating with the penetrating holes respectively. The periphery of the through-hole is provided with an annular neck for allowing the distal end of the heat pipe to penetrate. The outer periphery of each annular neck is provided with notches on the presser. Each of the caps covers the annular neck, and it extends downwards to form protruding flaps. The flap passes through the notch to be folded outwards so as to abut the bottom surface of the presser.

The present invention is to provide a method for assembling a fins-type heat sink, which includes the steps of:

(a) A heat sink, a presser and a plurality of caps are provided. The heat sink has a heat pipe and a plurality of fins disposed on the heat pipe. The presser is provided with through-holes allowing the distal end of the heat pipe to be inserted therein. The periphery of each through-hole is provided with an annular neck. The presser is provided with notches that are arranged circumferentially outside the annular neck.

(b) The caps are covered on the annular necks of the presser. The caps each extend downwards to form protruding flaps penetrating the notches respectively.

(c) A plate-like die is disposed on the topmost fin of the heat sink.

(d) The distal end of the heat pipe penetrates the through-hole of the presser to abut inside the cap. At the same time, the flap is folded outwards by means of the plate-like die.

According to the present invention, the respective fins of the heat sink can be pressed by the presser, so that these fins cannot be detached from the heat pipe easily. By means of the pressing force exerted by the presser to the respective fins, the distal end of the heat pipe can abut inside the cap. Also, the annular neck of the presser is shrunk on the heat pipe due to the inward pressing of the cap, thereby reinforcing the strength of connection between the fins and the heat pipe and avoiding the separation of the presser from the heat pipe.

DETAILED DESCRIPTION OF THE INVENTION

In order to make the Examiner to further understand the characteristics and technical contents of the present invention, a detailed description relating thereto will be made with reference to the accompanying drawings. However, the drawings are illustrative only but not used to limit the present invention.

Figure 1:
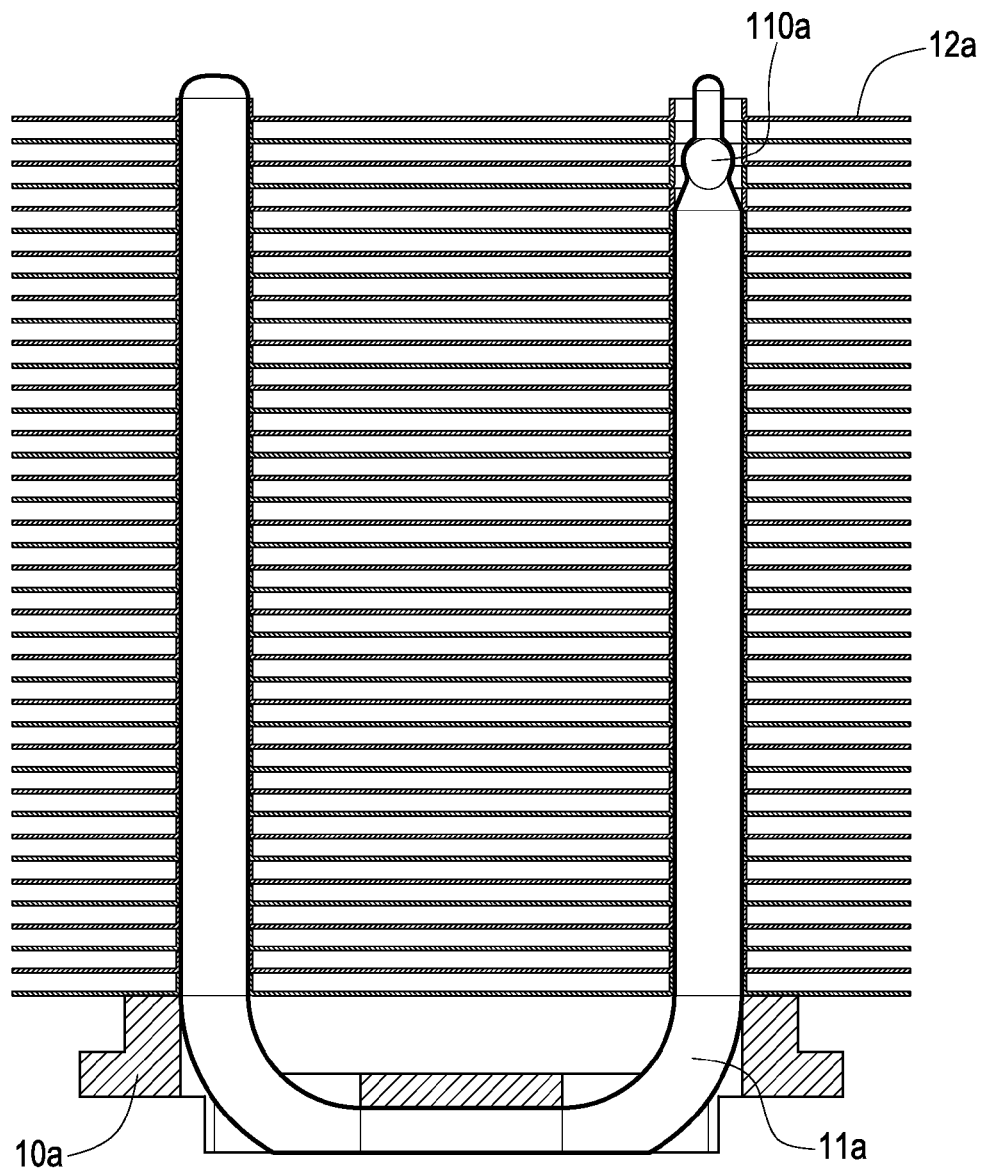
FIG. 1 is a cross-section view showing a conventional heat sink.
Figure 2:
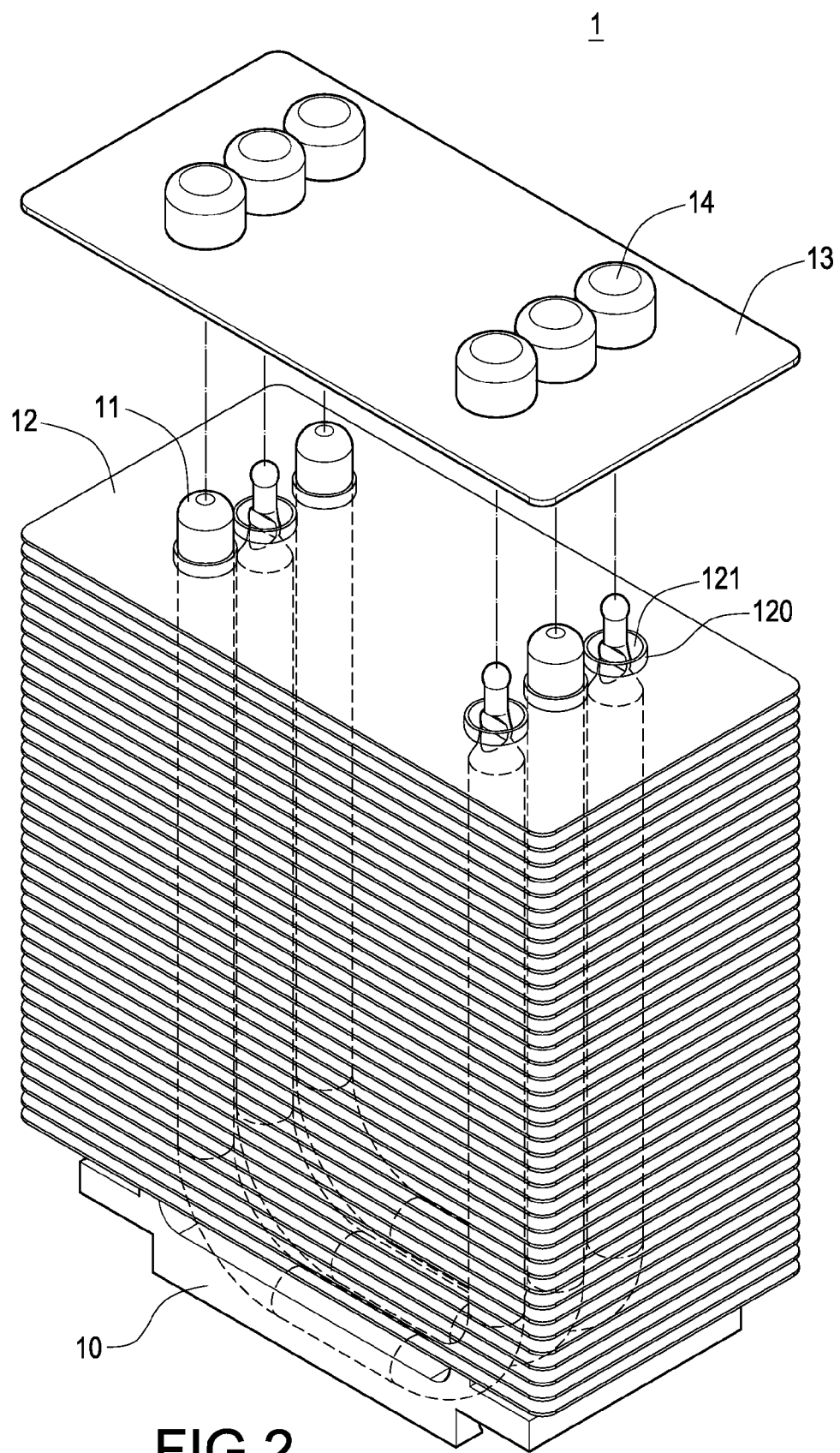
FIG. 2 is an exploded view showing the heat sink of the present invention.
Figure 3:
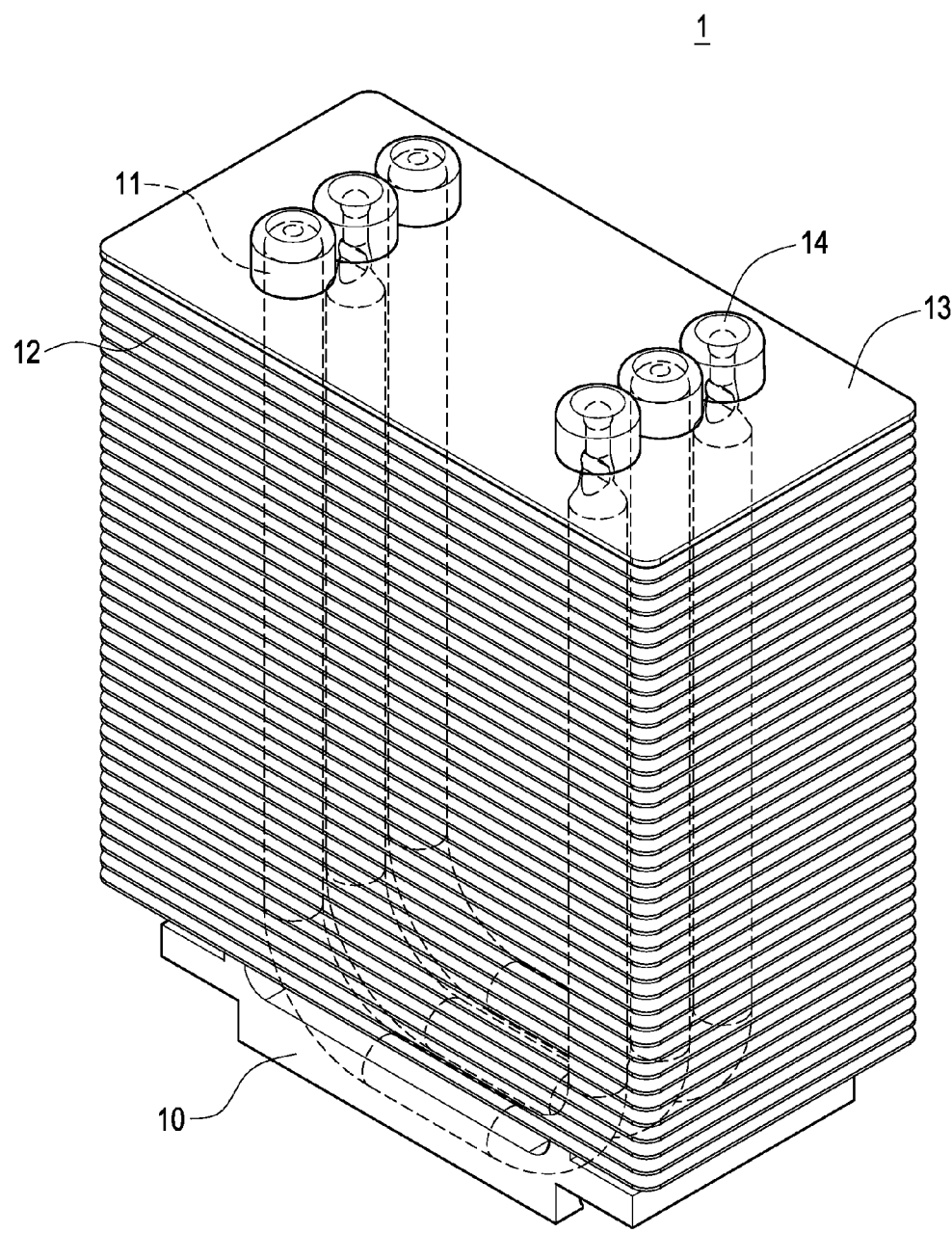
FIG. 3 is an assembled view showing the heat sink of the present invention.

The present invention provides a fins-type heat sink and a method for assembling the same. Please refer to FIGS. 2 and 3, which are an exploded view and an assembled view of the heat sink of the present invention respectively. The heat sink 1 includes a base 10, at least one heat pipe 11, a plurality of fins 12, a presser 13 and a plurality of caps 14.

The base 10 is made of a heat-conducting material and is attached to a heat source (not shown) for dissipating the heat generated by the heat source. The heat pipe 11 is thermally connected on the base 10. The fins 12 penetrate the heat pipe 11 and are overlapped with each other. Each of the fins 12 is made of a heat-conducting material, and it is provided with penetrating holes 120 for allowing the heat pipe 11 to penetrate therein. The periphery of each penetrating hole 120 is formed with an annular wall 121, so that the fins 12 are separated from each other via the respective annular walls 121.

Figure 4:
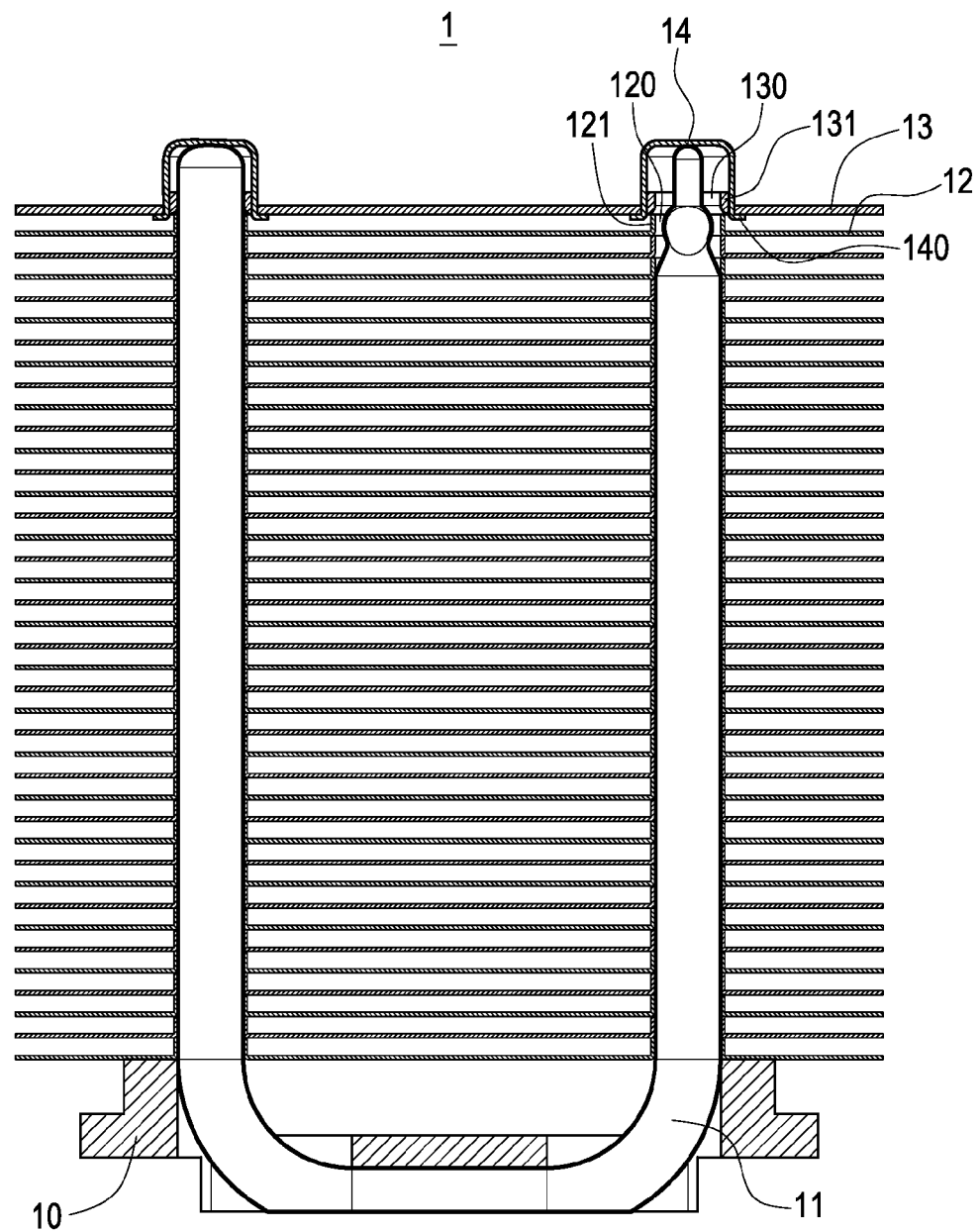
FIG. 4 is a cross-sectional view showing the heat sink of the present invention.

Please refer to FIG. 4. In the present invention, the presser 13 and the caps 14 are further provided over the fins 12, thereby preventing the fins 12 from falling off the heat pipe 11. The presser 13 is also made of a heat-conducting material. The thickness of the presser 13 can be larger than that of the respective fins 12, thereby providing a better structural strength. The steps for assembling the heat sink will be described as follows.

Figure 5:
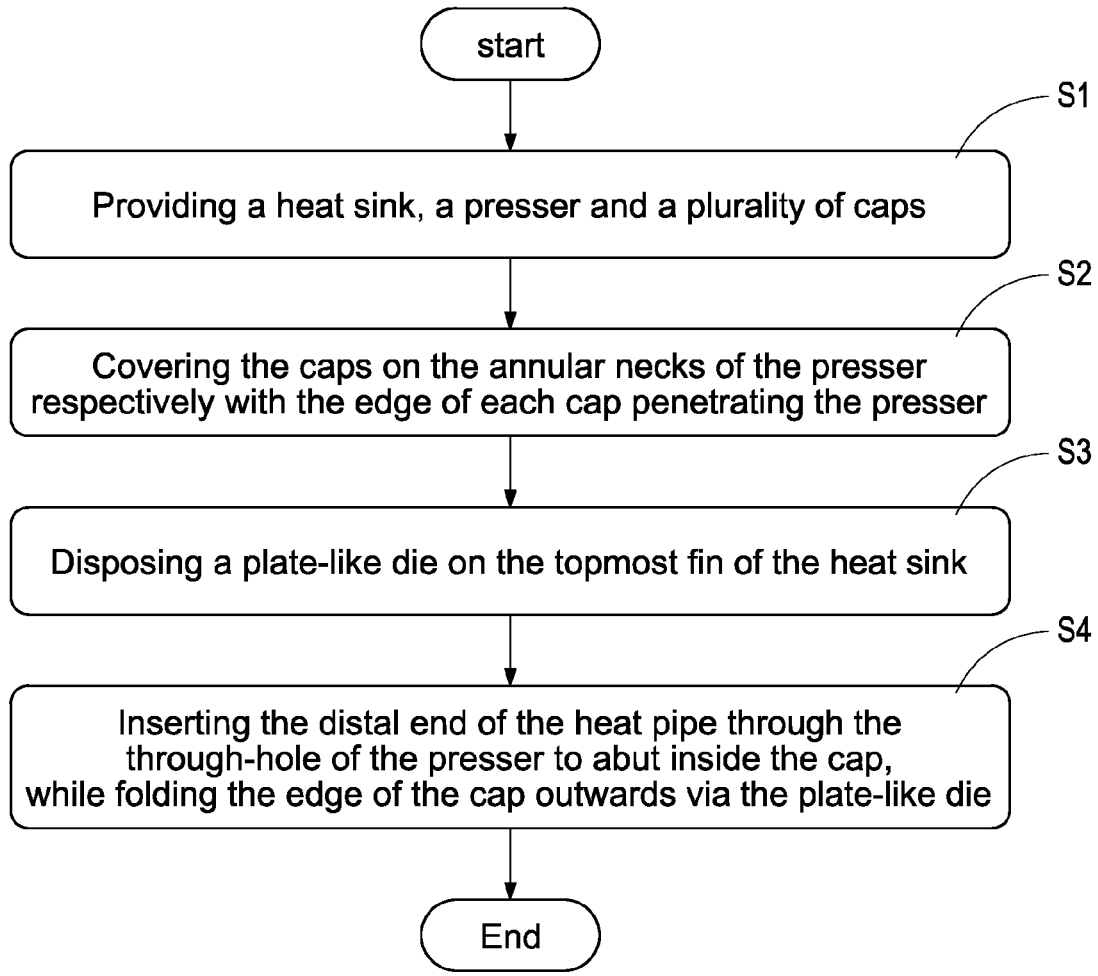
FIG. 5 is a flow chart showing the steps of the assembling method of the present invention.

Please refer to FIG. 5. In the step S1, at first, a heat sink 1, a presser 13 and a plurality of caps 14 are provided. The heat sink 1 has a structure of the above-mentioned characteristics. The presser 13 is provided with through-holes 130 that correspond to the penetrating holes 120 of each fin 12 respectively and allow the distal ends of the heat pipe 11 to be inserted therein. The periphery of each through-hole 130 is provided with an annular neck 131. The presser 13 is provided with notches 132 that are arranged circumferentially outside the annular neck 131.

Figure 6:
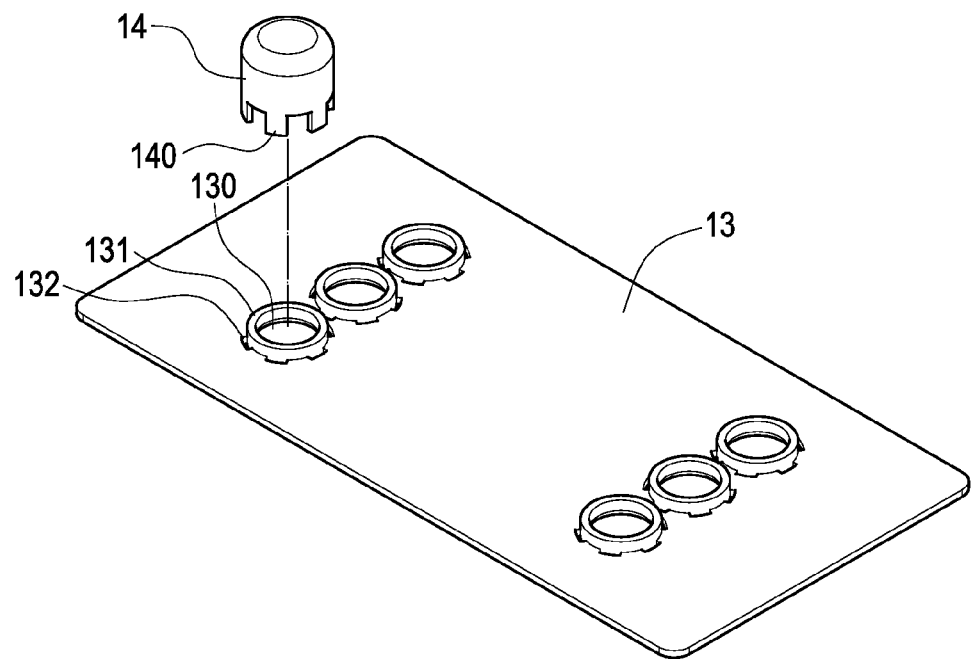
FIG. 6 is an exploded view showing the presser and the cap of the present invention.
Figure 7:
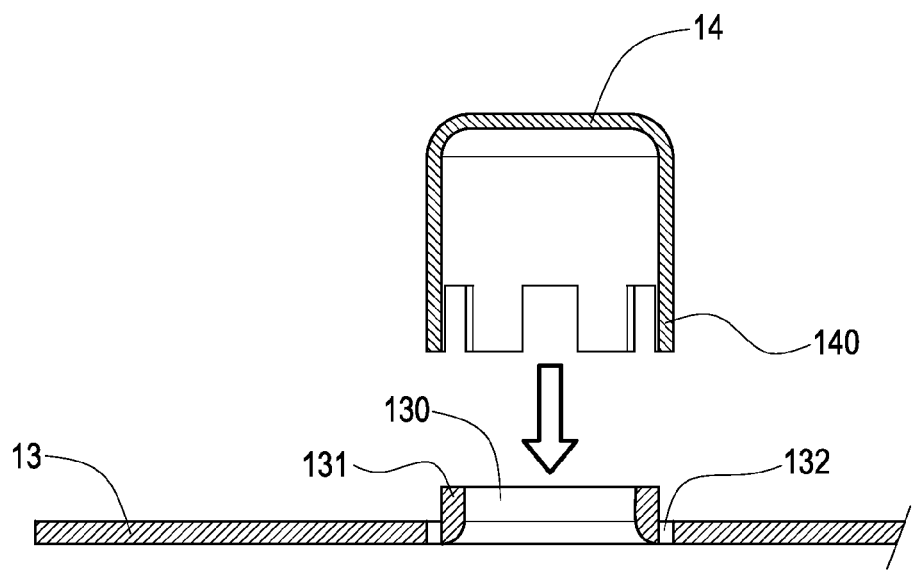
FIG. 7 is a schematic view showing the assembly of the presser and the cap of the present invention.

Please refer to FIGS. 5 and 6. In the step S2, the caps 14 are covered on the annular neck 131 of the presser 13 respectively. The caps 14 each extend downwards to form protruding flaps 140 penetrating the notches 132 respectively (FIG. 7). When the flap 140 penetrates the notch 132, it is slightly folded into an inclined orientation.

Figure 8:
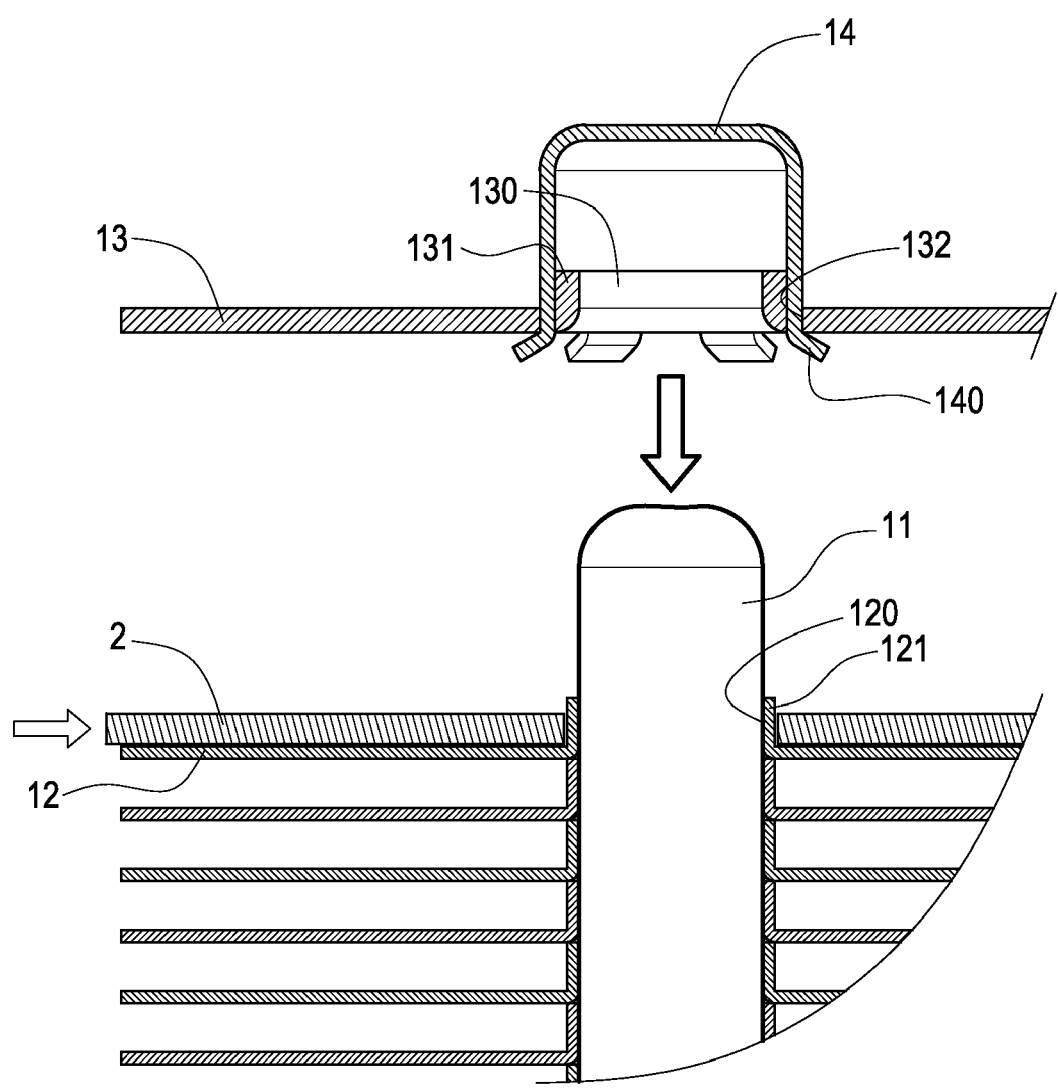
FIG. 8 is a schematic view showing the operating state before the assembly of the heat sink with the presser and the cap of the present invention.

Please refer to FIGS. 5 and 8. In the step S3, a plate-like die 2 is disposed on the topmost fin 12 of the heat sink 1. The thickness of the plate-like die 2 is substantially identical to the pitch between the respective fins 12.

Figure 9:
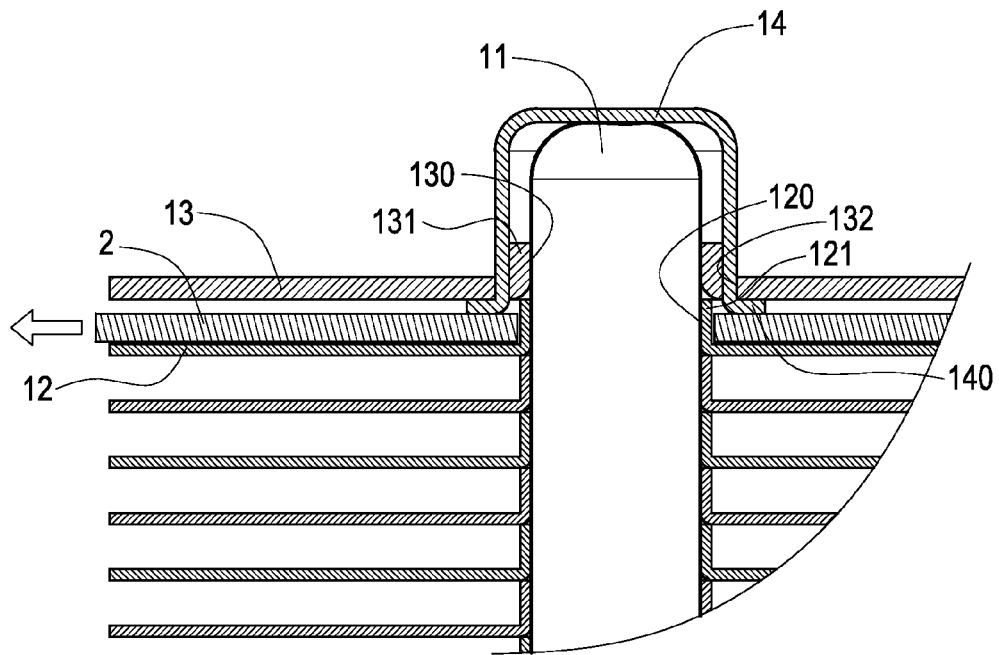
FIG. 9 is a schematic view showing the operating state during the assembly of the heat sink with the presser and the cap of the present invention.
Figure 10:
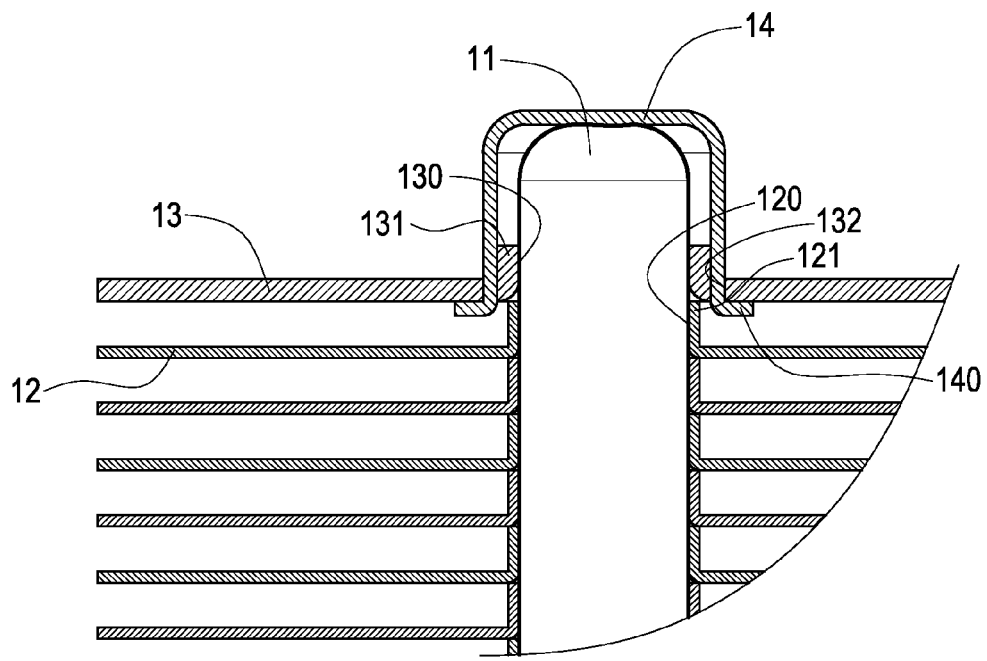
FIG. 10 is a schematic view showing the operating state after the assembly of the heat sink with the presser and the cap of the present invention.

Please refer to FIGS. 5 and 9. In the step S4, finally, the distal end of the heat pipe 11 penetrates the through-hole 130 of the presser 13 to abut inside the corresponding cap 14. At the same time, by means of the plate-like die 2, the flap 140 is folded outwards at a right angle so as to abut the bottom surface of the presser 13 (FIG. 10).

According to the present invention, the respective fins 12 can be pressed by the presser 13, so that these fins 12 cannot be detached from the heat pipe 11 easily. By means of the pressing force exerted by the presser 13 to the respective fins 12, the distal ends of the heat pipe 11 can abut inside the caps 14. Also, the annular neck 131 of the presser 13 is shrunk on the heat pipe 11 due to the inward pressing of the cap 14, thereby reinforcing the strength of connection between the fins 12 and the heat pipe 11 and avoiding the separation of the presser 13 from the heat pipe 11.

Therefore, via the above arrangement, the fins-type heat sink and the method for assembling the same according to the present invention can be obtained.

According to the above, the present invention achieves the expected effects and overcomes the drawbacks of prior art. Further, the present invention really demonstrates novelty and inventive steps and thus conforms to the requirements for an invention patent.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A method for assembling a fins-type heat sink, comprising the steps of:
   (a) providing a heat sink (1), a presser (13) and a plurality of caps (14), the heat sink (1) having a heat pipe (11) and a plurality of fins (12) disposed on the heat pipe (11), the presser (13) being provided with through-holes (130) allowing the distal ends of the heat pipe (11) to be inserted therein, a periphery of each through-hole (130) being provided with an annular neck (131), the presser (13) being provided with notches (132) that are arranged circumferentially outside the annular neck (131);
   (b) covering the caps (14) on the annular necks (131) of the presser (13) respectively, each caps (14) extending downwards to form protruding flaps (140) penetrating the notches (132);
   (c) disposing a plate-like die (2) on the topmost fin (12) of the heat sink (1); and
   (d) inserting a distal end of the heat pipe (11) through the through-hole (130) of the presser (13) to abut inside the cap (14), while folding the flaps (140) outwards via the plate-like die (2).

2. The method according to claim 1, wherein in the step (b), each of the flaps (140) is folded outwards after penetrating the notch (132).

3. The method according to claim 1, wherein in the step (c), a thickness of the plate-like die (2) is substantially identical to the pitch between the respective fins (12).

* * * * *